United States Patent [19]

D'Amato

[11] Patent Number: 5,150,727
[45] Date of Patent: Sep. 29, 1992

[54] FALSE BOTTOM SUMP

[75] Inventor: Mark D'Amato, Montreal, Canada

[73] Assignee: D.E.M. Controls of Canada, Montreal, Canada

[21] Appl. No.: 617,693

[22] Filed: Nov. 26, 1990

[51] Int. Cl.⁵ .................................................. B08B 3/02
[52] U.S. Cl. .................................. 134/104.2; 134/135; 134/182; 51/424; 51/321
[58] Field of Search ............... 134/111, 182, 183, 135, 134/130, 104.2, 104.3, 56 D, 57 D, 58 D, 200; 15/DIG. 3; 51/424, 317, 319, 426, 320, 321

[56] References Cited

U.S. PATENT DOCUMENTS

| | | | |
|---|---|---|---|
| 2,229,663 | 1/1941 | Meeker et al. | 134/111 |
| 2,621,673 | 12/1952 | Hodgens, Jr. | 134/186 X |
| 2,698,627 | 1/1955 | Kearny et al. | 134/111 |
| 2,894,631 | 7/1959 | Levit et al. | 134/111 X |
| 3,020,917 | 2/1962 | Lyman | 134/111 X |
| 3,064,666 | 11/1962 | Weiss et al. | 134/186 X |
| 3,067,757 | 12/1962 | Fox | 134/111 |
| 3,070,104 | 12/1962 | Faust et al. | 134/111 X |
| 3,291,144 | 12/1966 | Diamond | 134/111 |
| 3,352,063 | 11/1967 | Eppler . | |
| 3,555,990 | 1/1971 | Dittman | 134/186 |
| 3,971,394 | 7/1976 | Osborne | 134/111 |

Primary Examiner—Frankie L. Stinson
Attorney, Agent, or Firm—Stetina and Brunda

[57] ABSTRACT

A fluid baffle positionable between a fluid sprayer and sump of a chemical processing machine, a preferred embodiment of which comprises an insert positionable within an existing catch tank or sump. A solution or suspension emanating from the sprayer and rolling down the sloped surface of the baffle will enter the sump through openings formed within the lower edge of the sloped surface thereby entering the sump at a distal location from the pumps used to transfer fluid from the sump back to the sprayers. The sump itself includes generally rounded corners so as to eliminate the formation of fluid retentive dead zones therein. The utilization of the baffle in conjunction with the rounded corners of the sump provides complete and efficient recirculation of the fluid within the processing machine.

13 Claims, 1 Drawing Sheet

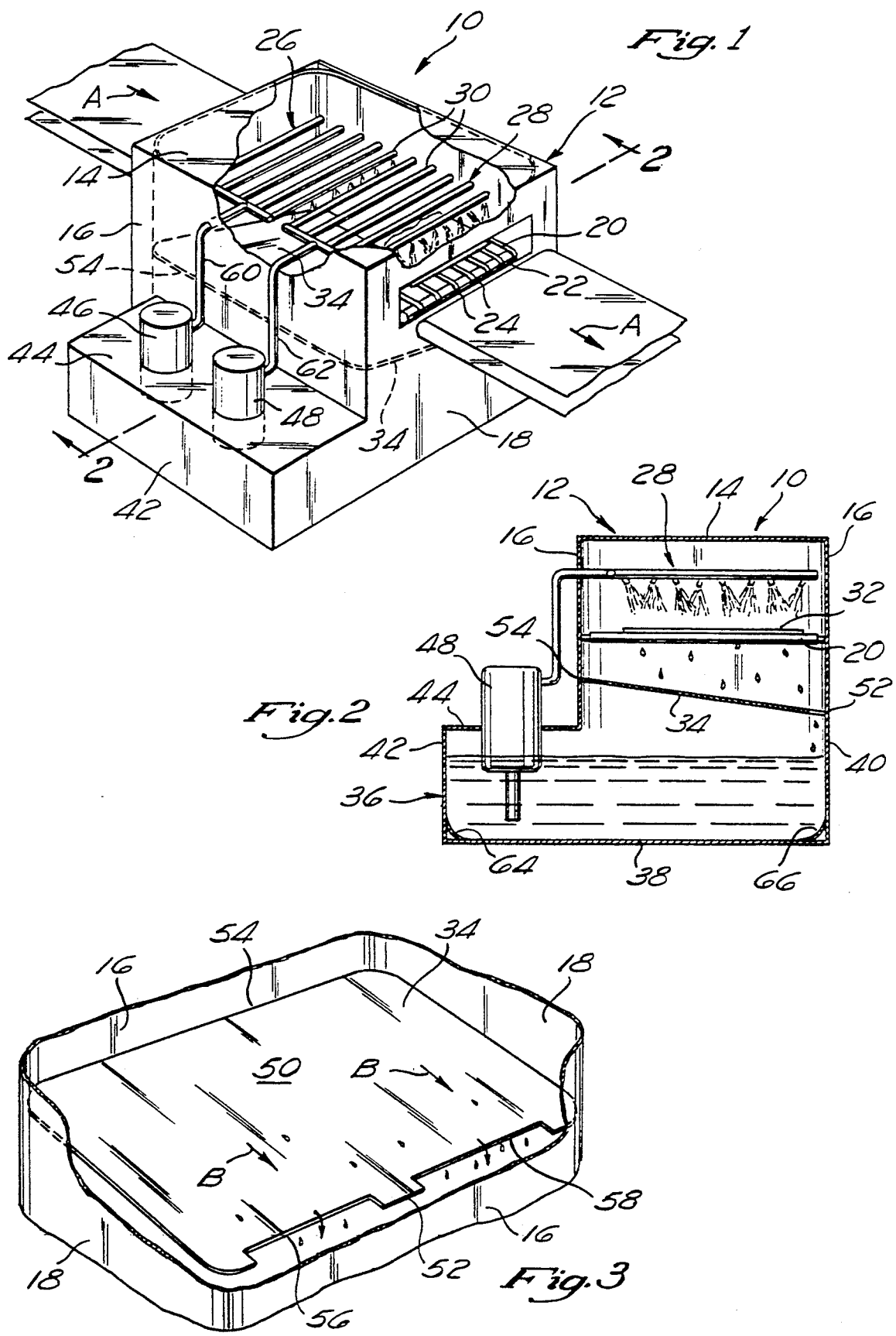

FALSE BOTTOM SUMP

BACKGROUND OF THE INVENTION

The present invention pertains generally to chemical process technology and more particularly to a fluid baffle, said baffle being positionable beneath a sprayer and/or within an existing fluid connecting tank or sump so as to facilitate continuous and complete mixing and/or recirculation of a liquid chemical, solution or suspension held therein.

The fluid baffle of the present invention is particularly useful in chemical process machines used in the manufacture of printed circuit boards and will be described herein with particular reference thereto. It will be appreciated, however, that the fluid baffle of the present invention may be useable in connection with many types of chemical process machines in addition to those employed in circuit board manufacturing applications.

It is common practice in the field of electronic circuit board manufacturing to employ conveyorized, spray process machines wherein one or more liquid chemicals, suspension or solutions are spray applied to circuit boards as they pass along a fixed conveyor path. Considerations of economy normally require that the liquid chemical, suspension or solution be recirculated and reused numerous times until such liquid chemical, solution or suspension has become chemically exhausted, contaminated or otherwise no longer useable. Typical spray process machines used in such applications generally comprise one or more mechanical conveyors having sprayer heads or nozzles positioned above and/or below the conveyor so as to spray apply the desired chemical solutions and/or suspensions to the circuit boards as they move along the conveyor path. A sump or catch tank is positioned below the conveyor to catch the runoff liquid chemical, solution and/or suspension after it has been spray applied to the passing circuit boards. This solution and/or suspension is accumulated within the sump or catch tank and is then taken up by one or more pumps, recirculated to the spray heads/spray nozzles wherefrom it is resprayed upon the conveyor path.

The use of standard spray processing machinery with certain suspensions or slurries is problematic. For example, when unstable suspensions (e.g. a slurry of pumice particles within a liquid matrix) are employed, it is generally desirable to maintain such suspensions under substantially continuous motion to prevent settling and separation of particulate matter. Many sumps are, however, not properly designed to permit the continuous motion to hold the material in suspension. In most spray process machines the sumps used in recirculating the liquid chemical, suspensions or solutions incorporate sharp corners or "dead zones" wherein the suspension may settle out and cake. Such settling out and caking is undesirable in that it results in a diminution in the concentration of solid particulate matter contained in the recirculating suspension/slurry and, further, because it complicates emptying and cleaning the sump interior.

The use of certain liquid chemicals or solutions in standard collection sumps may also be problematic. For instance, solutions which tend to form precipitates or chemicals which require substantial oxygenation may tend to form such precipitate or become oxygen depleted if allowed to stand within sharp corners or dead zones without periodic recirculation, turnover and/or aeration. Such precipitate formation or oxygen depletion may result in diminished reactivity of the solution or processing problems to the clogging of certain machine components with solid precipitant matter.

Thus, there remains a need in the art for an improved sump or tank configuration which will permit efficient, complete recirculation and mixing of liquids, suspensions or solutions without permitting such liquids to stand idle or become trapped within grooves, corners or other specific areas of the sump.

SUMMARY OF THE INVENTION

The present invention comprises a fluid baffle positionable beneath a fluid sprayer to facilitate the recirculation and turnover of liquid solution or suspension emanating from the sprayer. The baffle of the present invention generally comprises a plate-like structure which may be formed as an insert positionable within a spray process machine so as to act as a barrier between the sprayer and fluid connection sump or tank. Such insert comprises a generally sloped fluid contacting surface having one or more openings formed therein, so that fluid falling upon the fluid contacting surface will run downwardly into such opening(s). The baffle is preferably devoid of ridges or other regions wherein solution or suspension may become locked or retained.

In most spray process machines the pumps used in recirculating the liquid chemicals, suspensions or solutions from the sump to the sprayer are disposed along one wall of the sump. The baffle of the present invention is intended to be placed within a processing machine of this design such that the lowest edge of the sloped surface is abutted against the wall of the sump opposite the wall along which the pumps are disposed, with the highest edge being abutted against the same wall along which the pumps are disposed. In this respect, the upper fluid contacting surface of the baffle acts as a slide upon which liquid and/or suspensions may run downwardly into the opening(s) formed therein. Thus, fluid falling through the openings and into the sump will enter the sump on the side opposite that of the pumps. The continuous action of the pumps connected to the sump in pumping chemicals, suspensions or solutions from the sump to the sprayer causes such fluids to circulate across the sump to the pups. The baffle, therefore, modifies the direction of fluid flow within the sump to make fluid flow more uniformly toward the pump, thereby facilitating fluid turnover in the sump. Importantly, the movement of the fluid down the baffle, through the openings and across the sump to the pumps causes mixing, thereby helping to maintain homogeneity of the liquid, solution or suspension. In the preferred embodiment of the present invention, the baffle is used in conjunction with a sump which is devoid of any sharp corners, ridges or other regions wherein solution or suspension may become locked or retained as would prevent subsequent aspiration, removal and recirculation thereof. In this regard, the utilization of the baffle in conjunction with the rounded corners of the sump eliminates the formation of any dead zones within the fluid and prevents fluid from becoming trapped or standing within specific regions of the sump. The rounded edges of the sump further facilitate recirculation of the fluid therein in that some pumps used in conjunction with sumps of spray process machines will move the fluid contained in the sump in a circular pattern due to the centrifugal motion of the pump. In this respect, the rounded edges take advantage of such motion thereby allowing the liquid to move uniformly about the sump perimeter.

The baffle of the present invention also serves to reinforce the equipment structure and to keep chemical fumes down in the sump. Further, in accordance with the invention, the baffle may be made of molded plastic such as fiberglass reinforced plastic or vacuum formed PVC sheets.

To facilitate placement of the baffle insert into a standard fluid bin or sump, the underside of the insert is provided with one or more fins, members or feet to facilitate positioning and stable placement of the insert within a desired fluid bin or sump.

The term "fluid" as used herein shall pertain to suspensions and slurries as well as liquid solutions and other substances typically referred to as fluids.

Further objects and advantages of the invention will become apparent to those skilled in the art upon reading and understanding of the following detailed description of a preferred embodiment and consideration of the accompanying drawings.

BRIEF DESCRIPTION OF THE DRAWINGS

FIG. 1 is a perspective view of a conveyorized spray process machine having a fluid baffle insert of the present invention positioned therein;

FIG. 2 is a cross-sectional view through line 2—2 of FIG. 1; and

FIG. 3 is a cutaway perspective view of a standard fluid collection sump having a fluid baffle insert of the present invention positioned therein.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Referring to the drawings, FIG. 1 shows a cutaway perspective view of a conveyorized spray process machine 10 in the nature of a pumice scrubbing machine used in the manufacture of printed circuit boards. For purposes of this detailed description, the processing machine 10 will be described as a pumice scrubbing machine operative to spray a pumice slurry onto circuit boards as they pass along a conveyor. It will be appreciated, however, that the invention is useable with many types of machinery wherein various liquid chemical solutions and/or suspensions are pumped or recirculated.

The pumice scrubbing machine 10 shown comprises a generally rectangular housing or enclosure 12 having a top panel 14, side panels 16 and end panels 18. A conveyor 20 extends longitudinally through the housing 10 and serves to transport workpieces such as printed circuit boards through the housing enclosure 12 in the direction of arrows A. The conveyor 20 may comprise any type of conveyor assembly, including but not limited to standard belt or opposed roller type conveyors and the like. For purposes of this detailed description, however, the conveyor 20 shown in the drawings comprises a plurality of revolving plastic straps 24 arranged in a staggered relationship to one another so as to convey the workpieces through the housing 10 without continually covering or preventing the spraying from impinging against any portion of the workpiece.

The conveyor 20, as shown, consists of a series of pulleys or rollers 22 extending transversely within housing enclosure 12. Plastic bands or straps 24 extend around the rollers 22 so as to form a continuous series of revolving belt or strap type conveyor assemblies. In many circuit board applications upper and lower conveyor assemblies of the aforementioned type are employed and the circuit boards or portions thereof are passed between opposing upper and lower belts or straps 24.

An abrasive pumice slurry (e.g. amorphous pumice particles suspended in water) is maintained in continual suspension and sprayed downwardly upon circuit boards as they pass along the conveyor path. Such spraying is accomplished by passing pressurized pumice slurry into spray manifolds 26, 28. Each spray manifold 26, 28 consists of a plurality of transverse pipe members 30 which extend transversely within the interior of enclosure 12 above the conveyor 20. Of course, additional lower spray manifolds may be positioned beneath the conveyor 20 for purposes of spraying upwardly on the passing circuit boards as well. However, in this schematic showing, only upper manifolds 26, 28 are shown.

As depicted in the operational schematic of FIG. 2, as a circuit board 32 passes along conveyor 20 beneath spray manifold 28, the spray emanating from manifold 28 impinges against the exposed surfaces of circuit board 32. After the suspension is sprayed upon the circuit board 32, the runoff falls through conveyor 20 and makes contact with a plate, such as the fluid baffle insert 34 of the present invention before falling into an underlying sump 36.

Sump 36 comprises a generally rectangular fluid collection bin having a floor 38, front side 40 and a back side 42. Rounded edges 64, 66 are useful to interface floor 38 to front side 40 and back side 42 in a manner to further facilitate turnover of fluid within the sump. Though not shown, the interface of front side 40 and back side 42 to end panels 18 is also accomplished through the utilization of rounded edges. As shown, the back portion of the sump 36 extends out of and beyond the side panel 16 of the machine housing 12. The portion of the sump 36 which extends beyond side panel 16 is covered by a top cover 44. In the embodiment shown in FIG. 1, pumps 46, 48 are mounted within top cover 44 and are operable to recirculate material from within sump 36 to manifolds 26, 28, respectively.

As shown, the fluid baffle 34 of the present invention is sized and configured to be slidably positionable within the interior of housing 12 between conveyor 20 and sump 36. The baffle 34 is preferably formed of molded reinforced plastic (e.g. fiberglass reinforced FRP or vacuum molded PVC sheet) or other material which is substantially resistant to the effects of pumice slurry or other chemicals held therein.

Referring now to FIGS. 2 and 3, fluid baffle 34 comprises a generally planar upper surface 50 having a front edge 52 and a back edge 54. Disposed within front edge 52 are notches 56, 58. Importantly, the baffle 34 is positioned within housing 12 so as to have a downwardly sloping orientation. In this respect, front edge 52 of baffle 34 is disposed at a level below back edge 54, such that baffle 34 slopes downwardly toward front side 40 of sump 36, away from pumps 46, 48.

OPERATION OF THE PREFERRED EMBODIMENT

The preferred fluid baffle insert 34 described herein is preferably inserted into the generally rectangular housing 12 of a pumice scrubber machine 10 or similar device. The fluid baffle 34 is positioned within housing 12 between conveyor 20 and sump 36. When secured within housing 12, the outer edges of baffle 34 abut the side panels 16 and end panels 18 of housing 12. Baffle 34 is positioned within housing 12 so as to have a downwardly sloping orientation wherein front edge 52 is disposed below back edge 54. In the preferred embodiment, baffle 34 is positioned so as to slope downwardly toward front side 40 of sump 36, away from pumps 46, 48.

A quantity of desired solution, suspension or slurry (e.g. the pumice slurry described in relation to the pumice scrubber application) is contained within sump 36. When pumps 46, 48 are energized, the solution, suspension or slurry is pumped from sump 36 through supply lines 60, 62 into spray manifolds 26, 28. The solution, suspension or slurry is then sprayed downwardly through nozzles mounted on manifolds 26, 28 such that the solution, suspension or slurry will strike circuit boards 32 passing along conveyor 20. The solution, suspension or slurry will run off the conveyor 20 and circuit board 32, and onto the upper surface 50 of fluid baffle 34. The solution, suspension or slurry striking upper surface 50 will then run downwardly on baffle 34, in the direction shown by arrows B in FIG. 3. The solution, suspension or slurry will roll or mix as it slides down the sloping surface, thereby becoming mixed and/or aerated. The solution, suspension or slurry will then fall through notches 56, 58 and into sump 36 where such recollected solution, suspension or slurry will again be recirculated via pumps 46, 48 into spray manifolds 26, 28. Due to the sloping orientation of baffle 34 the solution, suspension or slurry will enter sump 36 at a distal location from pumps 46, 48. Thus, such solution, suspension or slurry must circulate across the length of sump 36 before being pumped back to manifolds 26, 28. Such circulation is operable to prevent settling and separation of particulate matter thereby holding the material in suspension. Rounded edges 64, 66 of sump 36 as well as the rounded edges defining the interface between front side 40 and back side 42 to end panels 18 are operable to further prevent the formation of dead zones within sump 36, thereby further aiding in the prevention of the settling and separation of particulate matter. It will be appreciated however, that baffle 34 is still operable to prevent settling and separation of particulate matter in the fluid irrespective of whether sump 36 incorporates rounded edges.

What is claimed is:

1. A fluid baffle for use in facilitating recirculation of fluid discharged from a sprayer into a sump of a chemical processing machine for manufacturing printed circuit boards, the baffle being disposed within the processing machine between the spray and sump and being sized to substantially cover the sump so as to act as a barrier between the sprayer and sump, the baffle comprising:

an upper fluid contacting surface disposed at a sloped angle intermediate the sprayer and sump, the fluid contacting surface having an upper edge portion disposed proximate a sump pump, and a lower edge portion disposed distal to the sump pump; and at least one opening formed in the fluid contacting surface adjacent the lower edge portion thereof;

wherein the fluid contacting surface is operative to receive fluid discharged from the sprayer and mix and aerate the fluid as the fluid is directed downwardly by the sloped angle thereof towards the opening, were upon the fluid is drained into the sump distal the sump pump, thus preventing the settling and separation of particulate matter from the fluid within the sump due to the circulation of the fluid across the length of the sump before being pumped to the sprayer by the sump pump.

2. The device of claim 1 wherein the baffle comprises an inert positionable within an existing fluid sump.

3. The device of claim 2 wherein the insert is generally rectangular in configuration so as to be positionable within a generally rectangular fluid sump.

4. The device of claim 2 wherein the insert further comprises at least one mounting member operative to facilitate stable positioning of the insert within an existing fluid sump.

5. The device of claim 4 wherein the at least one mounting member comprises at least one liplike flange formed around the insert.

6. The device of claim 4 wherein the at least one mounting member comprises at least one member extending downwardly from the insert.

7. The device of claim 1 further comprising the sump, the sump being formed to have rounded lower corners.

8. The device of claim 1 wherein the baffle is formed of molded plastic.

9. The device of claim 1 wherein the baffle is formed of fiberglass reinforced plastic.

10. The device of claim 1 wherein the baffle is formed of vacuum formed polyvinylchloride.

11. The device of claim 1 wherein the fluid emanating from the sprayer comprises a suspension of solid particles within a liquid matrix, the desired state of said suspension being one of homogeneity, the baffle being operative to maintain the solid particles in a homogeneous suspension within the liquid matrix.

12. The device of claim 1 wherein the fluid emanating from the sprayer comprises a solution which tends to form a precipitate if permitted to stand motionless, the desired state of the solution being a precipitate-free solution, the baffle being operative to maintain the solution in sufficient motion to prevent the formation of the precipitate.

13. The device of claim 1 wherein the fluid emanating from the sprayer comprises a solution, the desired state of which is one of sufficient oxygenation, the baffle being operative to allow complete and sufficient aeration of the solution to effect a desired level of oxygenation thereof.

* * * * *